(12) United States Patent
Kimura

(10) Patent No.: US 11,669,125 B1
(45) Date of Patent: Jun. 6, 2023

(54) CLOCK GENERATION CIRCUIT

(71) Applicant: WILL SEMICONDUCTOR (SHANGHAI) CO. LTD., Shanghai (CN)

(72) Inventor: Hiroyuki Kimura, Sendai (JP)

(73) Assignee: WILL SEMICONDUCTOR (SHANGHAI) CO. LTD., Shanghai (CN)

( * ) Notice: Subject to any disclaimer, the term of this patent is extended or adjusted under 35 U.S.C. 154(b) by 0 days.

(21) Appl. No.: 17/833,995

(22) Filed: Jun. 7, 2022

(30) Foreign Application Priority Data

May 19, 2022 (CN) .......................... 202210553159.0

(51) Int. Cl.
| | |
|---|---|
| *G06F 1/08* | (2006.01) |
| *G06F 1/10* | (2006.01) |
| *H03K 5/00* | (2006.01) |
| *H03K 19/20* | (2006.01) |

(52) U.S. Cl.
CPC ................. *G06F 1/08* (2013.01); *G06F 1/10* (2013.01); *H03K 5/00006* (2013.01); *H03K 19/20* (2013.01)

(58) Field of Classification Search
CPC ....................................... G06F 1/08; G06F 1/10
USPC ........................................................... 327/117
See application file for complete search history.

(56) References Cited

U.S. PATENT DOCUMENTS 8,837,639 B2 * 9/2014 Cordos ................. H04L 7/0338
375/322

* cited by examiner

*Primary Examiner* — Tomi Skibinski
(74) *Attorney, Agent, or Firm* — Muncy, Geissler, Olds & Lowe, P.C.

(57) ABSTRACT

The clock generation circuit outputs a clock signal with a constant cycle by repeating the following operations: when an enable signal becomes a H level, the clock signal immediately rises, and a sense end is changed to a L level via a first capacitor, then a voltage of the sense end is gradually increased via a resistor, and when the sense end reaches a predetermined potential, an output of a second inverter becomes the L level, the clock signal becomes the L level, an inverted clock signal becomes the H level, and accordingly the sense end becomes the H level; and thereafter, a current flows via the resistor so that the voltage of the sense end decreases gradually, when the sense end reaches a predetermined potential, the output of the second inverter becomes a H level, the clock signal becomes the H level, the sense end is changed to a L level via the first capacitor, then the voltage of the sense end is gradually increased via the resistor, and when the sense end reaches a predetermined potential, the output of the second inverter becomes the L level and the clock signal becomes the L level.

3 Claims, 3 Drawing Sheets

US 11,669,125 B1

CLOCK GENERATION CIRCUIT

BACKGROUND OF THE INVENTION

1. Field of the Invention

The disclosure relates to a clock generation circuit using a capacitor and a resistor.

2. Description of the Related Art

Conventionally, there has been known a clock generation circuit that generates a clock signal with a constant frequency by charging and discharging a capacitor.

The clock generation circuit has a problem that a relatively long time is required for generating a clock signal with a stable cycle.

Therefore, a circuit capable of generating a stable clock at an early stage is desired.

SUMMARY OF THE INVENTION

The clock generation circuit according to the disclosure includes:

an AND gate, in which an enable signal is input to one end and which outputs a clock signal;

a first inverter, in which one end is connected to an output end of the AND gate and which inverts and outputs the clock signal;

a first capacitor, in which an inverted clock signal from the first inverter is supplied to one end, and the other end is connected to one end of a second capacitor;

a resistor, in which the clock signal from the AND gate is supplied to one end, and the other end is connected to a sense end which is a connection point between the first capacitor and the second capacitor; and a second inverter, in which one end is connected to the sense end, and the other end is connected to the other end of the AND gate, and the clock generation circuit outputs a clock signal with a constant cycle by repeating the following operations: when the enable signal becomes a H level, the clock signal immediately rises, and the sense end is changed to a L level via the first capacitor, then a voltage of the sense end is gradually increased via the resistor, and when the sense end reaches a predetermined potential, an output of the second inverter becomes the L level, the clock signal becomes the L level, the inverted clock signal becomes the H level, and accordingly the sense end becomes the H level; and thereafter, a current flows via the resistor so that the voltage of the sense end decreases gradually, when the sense end reaches a predetermined potential, the output of the second inverter becomes a H level, the clock signal becomes the H level, the sense end is changed to a L level via the first capacitor, then the voltage of the sense end is gradually increased via the resistor, and when the sense end reaches a predetermined potential, the output of the second inverter becomes the L level and the clock signal becomes the L level.

According to the clock generation circuit related to the disclosure, a stable clock signal can be generated at an early stage.

PREFERRED EMBODIMENT OF THE PRESENT INVENTION

Hereinafter, embodiments of the disclosure are described with reference to the drawings. Note that, the following embodiments do not limit the scope of the disclosure, and configurations obtained by selectively combining multiple examples are also included in the disclosure.

"Circuit Configuration"

Figure 1:
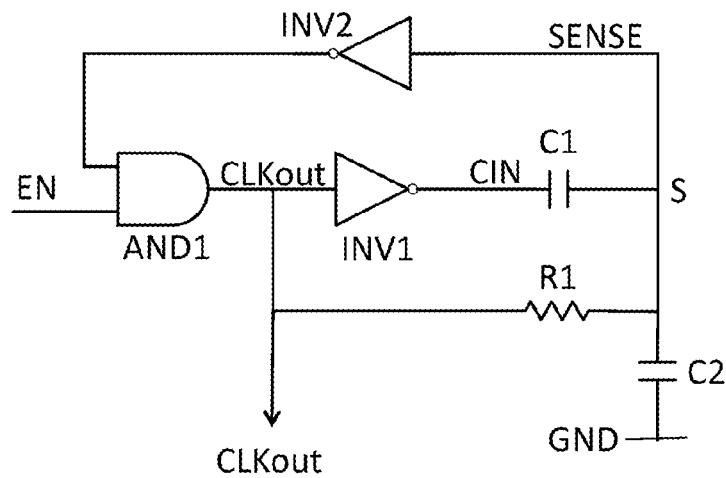
FIG. 1 is a block diagram showing a configuration of a clock generation circuit according to an embodiment of the present invention.

FIG. 1 is a block diagram showing a configuration of a clock generation circuit according to an embodiment of the present invention. An enable signal EN is input to one end of an AND gate AND1. A signal input to the other end will be described later.

A clock signal CLKout is obtained in an output of the AND gate AND1 and is output from the AND gate AND1. An output end of the AND gate AND1 is connected to an inverter INV1, and the clock signal CLKout is inverted to an inverted clock signal CIN by the inverter INV1. An output end of the inverter INV1 is connected to one end of a capacitor C2, and the other end of the capacitor C2 is connected to a ground GND. The connection point between a capacitor C1 and the capacitor C2 is a sense end S, and the voltage at the sense end S is a signal SENSE. Note that, the inverter INV1 is referred to as a first inverter, an inverter INV2 is referred to as a second inverter, the capacitor C1 is referred to as a first capacitor, and the capacitor C2 is referred to as a second capacitor.

The output end of the AND gate AND1 is connected to the sense end S which is the connection point between the capacitor C1 and the capacitor C2 via a resistor R1.

Therefore, the inverted clock signal CIN is supplied to the sense end S via the capacitor C1, and the clock signal CLKout is supplied to the sense end S via the resistor R1.

The other end of the AND gate AND1 is connected to the sense end S via the inverter INV2. Therefore, an inverted signal of the signal SENSE is supplied to the other input end of the AND gate AND1.

Figure 2:
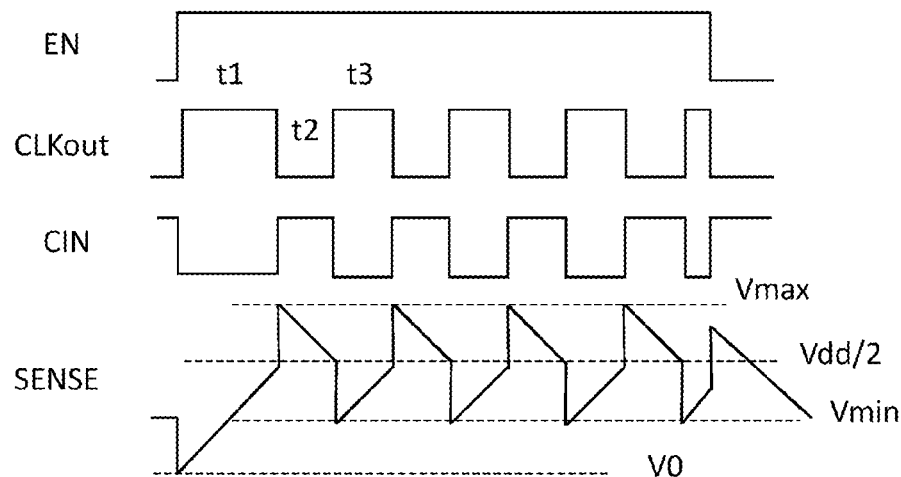
FIG. 2 is a timing chart illustrating operations of the clock generation circuit according to the embodiment of the present invention.

FIG. 2 is a timing chart illustrating operations of the clock generation circuit according to the embodiment of the present invention in FIG. 1. Note that, in the following descriptions, H level=Vmax=Vdd, and L level=Vmin=GND=0 V, but the disclosure is not limited thereto.

First, when the enable signal EN is at the L level, the clock signal CLKout is at the L level. Therefore, the sense end S connected to the output end of the CLKout via the resistor R1 is likewise at the L level. In addition, the inverted clock signal CIN is at the H level, and the capacitor C1 is at the H level at one end and is at the L level at the other end, and is in a charging state. Here, the H level of each signal is Vdd and the L level is ground GND=0 V, and the capacitor C1 is charged by Vdd.

In addition, the inverted signal of the signal SENSE is input to the other end of the AND gate AND1, and thus the H level is input to the other end of the AND gate AND1.

In this state, when the enable signal EN becomes the H level, the clock signal CLKout that is output from the AND gate AND1 becomes the H level. Consequently, the inverted clock signal CIN becomes the L level, and the voltage at one end of the capacitor C1 is decreased by Vdd.

Here, when the enable signal EN is at the L level, the clock signal CLKout is at the L level, and the sense end S is also at the L level. In addition, the sense end S is connected to the ground GND through the capacitor C2, and by decreasing the voltage at one end of the capacitor C1 by Vdd, the capacitors C1 and C2 are both in a state of being charged by Vdd/2, the voltage of the sense end S is decreased by Vdd/2, and becomes V0=−Vdd/2. Moreover, the voltage of the sense end S becomes Vdd/2 when the capacitances of the capacitors C1 and C2 are C1=C2, and the voltage of the sense end S becomes Vdd·C1/(C1+C2) when the capacitances of the capacitors C1 and C2 are not C1=C2.

At this time, the input of the AND gate AND1 at the other end remains at the H level and does not change. On the other hand, because of the H level of the clock signal CLKout, a current flows to the sense end S via the resistor R1, and the voltage of the sense end S gradually increases.

Then, when the voltage of the sense end S exceeds Vdd/2, the output of the inverter INV2 is inverted, the input of the AND gate AND1 at the other end becomes the L level, and the clock signal CLKout becomes the L level. Consequently, the inverted clock signal CIN becomes the H level and the voltage gets higher by Vdd, and the voltage of the sense end S increases by Vdd/2 and becomes Vdd.

Note that, a period t1 during which the clock signal CLKout is at the H level for the first time is a period from −Vdd/2 to +Vdd/2.

In this state, the CLKout is at the L level, the sense end S is at Vdd, the current flows to the CLKout output end via the resistor R1, and the voltage of the sense end S is gradually decreased. Then, when the voltage of the sense end S is lower than Vdd/2, the output of the inverter INV2 is inverted, the input of the AND gate AND1 at the other end becomes the H level, and the clock signal CLKout becomes the H level. The signal SENSE of the sense end S becomes GND. Note that, a period t2 during which the clock signal CLKout is at the L level for the first time is a period from Vdd/2 to +Vdd/2.

Because of the H level of the clock signal CLKout, the current flows to the sense end S via the resistor R1, and the voltage of the sense end S increases gradually. Then, when the voltage of the sense end S exceeds Vdd/2, the output of the inverter INV2 is inverted, the input of the AND gate AND1 at the other end becomes the L level, and the clock signal CLKout becomes the L level. The two periods t1 during which the clock signal CLKout is at the H level is a period t3 from Vdd to +Vdd/2, and t2=t3.

Thereafter, the clock signal CLKout with a duty ratio of 50% is output by repeating the same operations as in the periods t2 and t3. Then, the enable signal EN becomes the L level, so that the clock signal CLKout becomes the L level and the sense end S is discharged to 0 V.

In this way, the clock signal CLKout is repeated between the H level and the L level by the current flowing from the sense end S to the CLKout output end via the resistor R1. The amount of current flowing in the resistor R1 is also the same when the direction is opposite, and the duty ratio of the clock signal CLKout becomes 50% if the first H level is removed. In addition, the period of the clock signal CLKout is set based on the capacitance of the capacitor C2 and the resistance value of the resistor R1.

In addition, in the embodiment, the output of the clock signal CLKout is started as soon as the enable signal EN becomes the H level.

Here, the time t1 at which the clock signal CLKout is at the H level for the first time is described.

Note that, it is set that C=C1=C2, Vmax=Vdd, Vmin=0, and V0=−Vdd/2, and a time constant when charging and discharging the sense end S via the resistor R1 is set as T=2R1*C.

First, the current first reaching Vdd/2 is the current flowing to the sense end S via R1, and increases from −Vdd/2 to Vdd/2 (V1=3Vdd/2).

Therefore, $$Vdd/2 = V1*[1-\exp(-t1/T)] - V0$$

$$t1 = -T*\ln[1 - Vdd/((3/2)*Vdd)]$$

$$t1 = -T*\ln(1/3)$$
$$= 2R1*C*\ln 3$$

Next, the time t2 at which the clock signal CLKout is at the L level is described. In this case, the voltage of the sense end S decreases from Vdd to Vdd/2.

Therefore, $$Vdd/2 = Vdd*\exp(-t2/T)$$

$$\frac{1}{2} = \exp(-t2/T)$$

$$t2 = T*\ln 2$$

$$t2 = 2R1C*\ln 2.$$

"Configuration of Variation Example 1"

Figure 3:
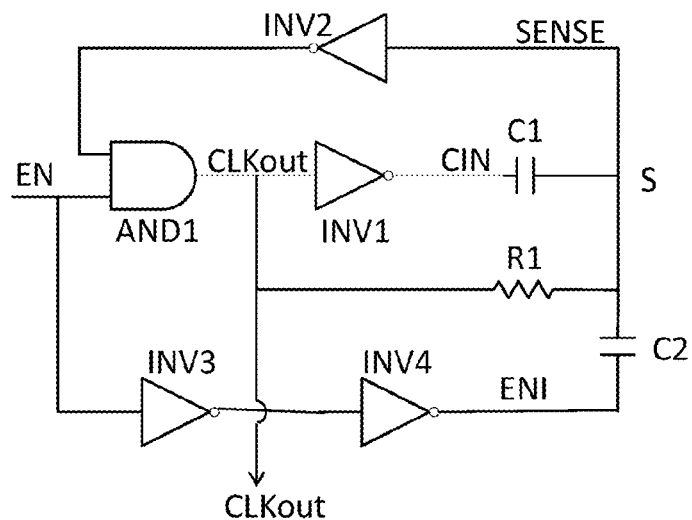
FIG. 3 is a block diagram showing a configuration of a clock generation circuit according to variation example 1.

FIG. 3 is a block diagram showing a configuration of the clock generation circuit according to Variation example 1. In this example, the other end (a lower end) of the capacitor C2 is not connected to the GND, and the enable signal EN is supplied via an inverter INV3 and an inverter INV4. Moreover, sufficient electric power can be supplied to the other end of the capacitor C2 by disposing two inverters INV3 and INV4.

Figure 4:
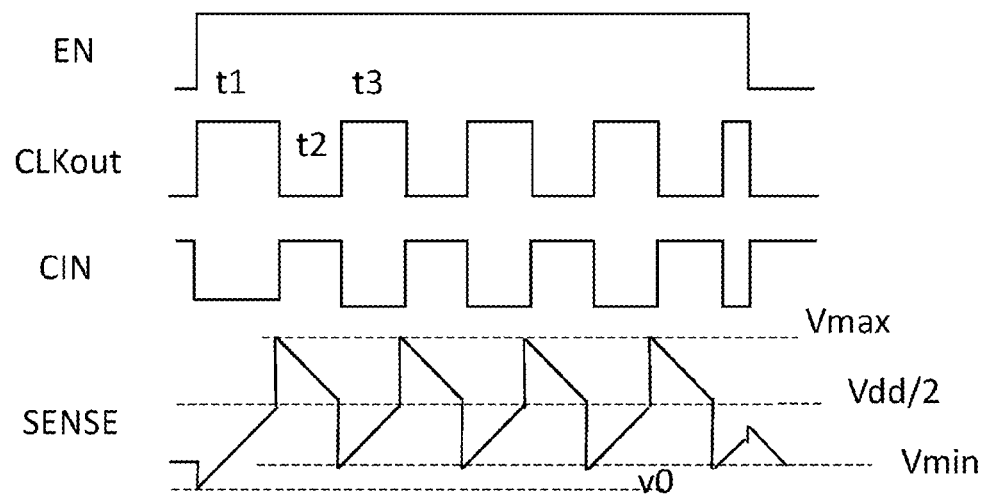
FIG. 4 is a timing chart illustrating operations according to variation example 1.

FIG. 4 is a timing chart illustrating operations according to Variation example 1 in FIG. 3. According to this way, the enable signal EN is supplied to the other end of the capacitor C2, and thereby when the enable signal EN becomes the H level, the voltage of the sense end S is close to 0 V rather than −Vdd/2. Although the initial voltage is described to be somewhat lower than 0 V in the figure, by making the inverters INV3 and INV4 and the like have sufficient capability, the initial voltage can be set to approximately 0 V. Therefore, the clock signal CLKout with the duty ratio of 50% from the beginning can be obtained.

"Configuration of Variation Example 2"

Figure 5:
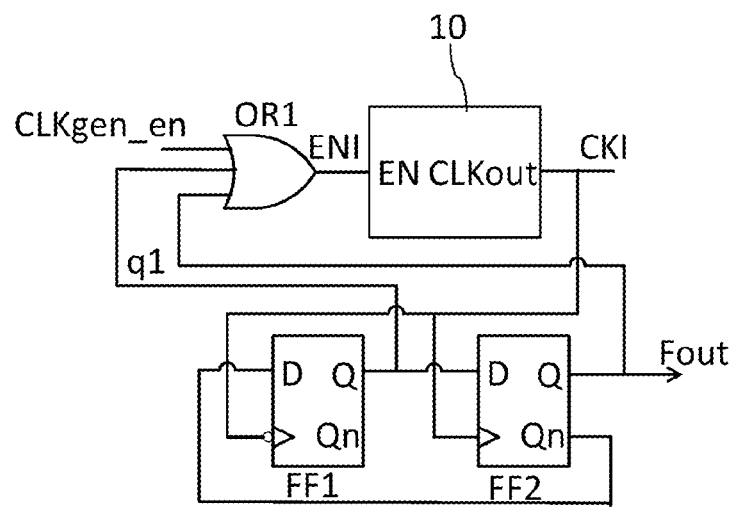
FIG. 5 is a block diagram showing a configuration of a clock generation circuit according to variation example 2.

FIG. 5 is a block diagram showing a configuration of the clock generation circuit according to Variation example 2.

In the clock generation circuit according to the embodiment and Variation example 1 described above, signals with different duty ratios are output when the enable signal EN is changed from the H level to the L level. In Variation example 2, the output of such a signal is prevented.

A clock generation portion 10 is the clock generation circuit described in FIG. 1. Note that, although the circuit in FIG. 3 can also be used, in Variation example 2, even if the circuit described in FIG. 1 is used, the time of the initial H level is also the same as the time of an other H level, and thus there is no need to use the circuit in FIG. 3.

A signal EM is input to the clock generation portion 10 as the enable signal EN. In addition, the above-described clock signal CLKout is output as a signal CKI.

The signal CKI is input to a frequency division circuit composed of two flip-flops FF1 and FF2. That is, the signal CKI is inverted and input to a clock end of the flip-flop FF1, and is directly input to a clock end of the flip-flop FF2. A Q output (signal q1) of the flip-flop FF1 is input to a D input end of the flip-flop FF2. Qn, which is an inverted Q output of the flip-flop FF2, is supplied to a D input end of the flip-flop FF1. A signal Fout is output as a clock signal from a Q output end of the flip-flop FF2.

The signal q1, the signal Fout, and a clock generation enable signal CLKgen_en are input to an OR gate OR1, and the signal ENI is output from the OR gate OR1.

In this circuit, the clock generation enable signal CLKgen_en is supplied as a signal indicating the start and end of the clock generation.

Figure 6:
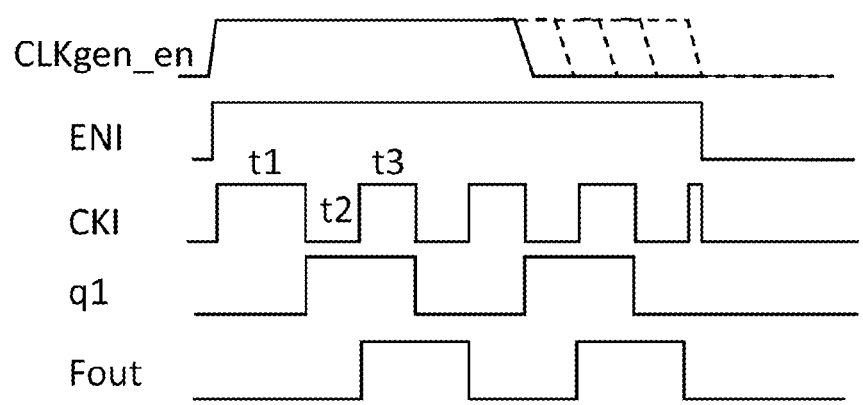
FIG. 6 is a timing chart illustrating operations according to variation example 2.

FIG. 6 is a timing chart illustrating operations of the circuit in FIG. 5.

First, when the clock generation enable signal CLKgen_en is at the L level, the signal CKI being the output signal of the clock generation circuit is at the L level. And, for the flip-flops FF1 and FF2, both are set to the L level at a time point when the signal EM falls, and both are set to the L level at a time point when the clock generation enable signal CLKgen_en rises from the L level to the H level.

When the clock generation enable signal CLKgen_en rises from the L level to the H level, the signal EM that is output from the OR gate OR1 becomes the H level, and the signal CKI that is output from the clock generation portion 10 starts to alternately output the H level and the L level.

By the rising of the signal CKI, the flip-flop FF2 captures the Q output (q1) of the flip-flop FF1, but the signal q1 remains at the L level. By the falling of the signal CKI, the flip-flop FF1 captures the H level of an inverted Q output Qn of the flip-flop FF2, and the signal q1 becomes the H level.

By the falling of the signal CKI, the flip-flop FF2 captures q1, and the signal Fout which is the Q output of the flip-flop FF2 becomes the H level.

By the rising of the signal CKI, the flip-flop FF2 captures the Q output (q1) of the flip-flop FF1, but the signal q1 is at the H level. By the next falling of the signal CKI, the flip-flop FF1 captures the L level of the inverted Q output Qn of the flip-flop FF2, and the signal q1 becomes the L level.

In this way, after the second rising of the signal EKI, the signal Fout having a period twice that of the signal CKI is output from the Q output of the flip-flop FF2.

Although the clock generation enable signal CLKgen_en falls from the H level to the L level, the signals q1 and Fout are also input to the OR gate OR1. Therefore, the signal ENI falls at a time point when both the signal q1 and the signal Fout become the L level, and the output of the signal CM is stopped (does not become the H level) at the time point. Even if a signal having a short period is output to the signal CKI, a signal having a different period is not output to the signal F out.

Moreover, the flip-flops FF1 and FF2 may be alternatively reset to the L level by the rising or falling of the signal ENI.

In this way, in Variation example 2, the output of the signal Fout always starts and ends at a constant cycle regardless of the timing of the start and end of the H level period of the clock generation enable signal CLKgen_en.

What is claimed is:

1. A clock generation circuit, comprising:
   an AND gate, in which an enable signal is input to one end and which outputs a clock signal;
   a first inverter, in which one end is connected to an output end of the AND gate and which inverts and outputs the clock signal;
   a first capacitor, in which an inverted clock signal from the first inverter is supplied to one end, and the other end is connected to one end of a second capacitor;
   a resistor, in which the clock signal from the AND gate is supplied to one end, and the other end is connected to a sense end which is a connection point between the first capacitor and the second capacitor; and
   a second inverter, in which one end is connected to the sense end, and the other end is connected to the other end of the AND gate,
   the clock generation circuit outputting a clock signal with a constant cycle by repeating the following operations:
      when the enable signal becomes a H level, the clock signal immediately rises, and the sense end is changed to a L level via the first capacitor, then a voltage of the sense end is gradually increased via the resistor, and when the sense end reaches a predetermined potential, an output of the second inverter becomes the L level, the clock signal becomes the L level, the inverted clock signal becomes the H level, and accordingly the sense end becomes the H level; and
   thereafter, a current flows via the resistor so that the voltage of the sense end decreases gradually, when the sense end reaches a predetermined potential, the output of the second inverter becomes a H level, the clock signal becomes the H level, the sense end is changed to a L level via the first capacitor, then the voltage of the sense end is gradually increased via the resistor, and when the sense end reaches a predetermined potential, the output of the second inverter becomes the L level and the clock signal becomes the L level.

2. The clock generation circuit according to claim 1, wherein
   by supplying the enable signal to the other end of the second capacitor, a decrease of the voltage of the sense end at a time point when the enable signal rises is suppressed.

3. The clock generation circuit according to claim 1, comprising
   a frequency division circuit that divides a frequency of the clock signal, wherein
   an output of the frequency division circuit is terminated by turning off the enable signal, and thereby unnecessary signals after the enable signal was turned off are removed.

* * * * *